United States Patent [19]

Lory et al.

[11] Patent Number: 5,013,691
[45] Date of Patent: May 7, 1991

[54] ANISOTROPIC DEPOSITION OF SILICON DIOXIDE

[75] Inventors: Earl R. Lory, Pennington, N.J.; Leonard J. Olmer, Austin, Tex.

[73] Assignee: AT&T Bell Laboratories, Murray Hill, N.J.

[21] Appl. No.: 386,650

[22] Filed: Jul. 31, 1989

[51] Int. Cl.$^5$ .............................................. H01L 21/90
[52] U.S. Cl. .................................... 437/238; 437/243; 148/DIG. 118
[58] Field of Search ..................... 437/238, 240, 243; 148/DIG. 118

[56] References Cited

U.S. PATENT DOCUMENTS 4,845,054  7/1989  Mitchener ......................... 437/240

FOREIGN PATENT DOCUMENTS

| 0208459 | 1/1987 | European Pat. Off. | 437/238 |
| 61-063020 | 4/1986 | Japan | 437/238 |
| 63-062238 | 3/1988 | Japan | 437/238 |
| 1-152631 | 6/1989 | Japan | 437/238 |
| 1-243553 | 9/1989 | Japan | 437/238 |

OTHER PUBLICATIONS

Wolf, S. ed., *Silicon Processing for the VLSI Era*, Lattice Press, Sunset Beach, CA (1986), p. 184.
"Step Coverage Prediction in Low-Pressure Chemical Vapor Deposition", by G. B. Raupp et al., *Chemistry of Materials*, vol. 1, No. 2, 1989, pp. 207–214.
"Silicon Dioxide Films Produced of PECVD of TEOS and TMCTS", by D. A. Webb et al., Electrochemical Society, Spring Meeting Abstracts, Abstract No. 181, May 8, 1989, p. 262.

*Primary Examiner*—Olik Chaudhuri
*Assistant Examiner*—Andrew Guffin
*Attorney, Agent, or Firm*—R. B. Anderson

[57] ABSTRACT

In a radio-frequency plasma deposition reactor (10), $SiO_2$ is deposited from a source (16) of tetraethoxysilane (TEOS). The deposition is made to be anisotropic, that is, to be deposited preferentially on horizontal surfaces, by use in the deposition atmosphere of a constituency such as $NH_3$ or $NF_3$ which inhibits $SiO_2$ deposition, along with a radio-frequency power in excess of 100 watts, which preferentially removes the inhibiting gas from horizontal surfaces through ion impact.

16 Claims, 2 Drawing Sheets

ANISOTROPIC DEPOSITION OF SILICON DIOXIDE

TECHNICAL FIELD

This invention relates to methods for making integrated circuit devices and, more particularly, to silicon dioxide deposition during integrated circuit fabrication.

BACKGROUND OF THE INVENTION

The technology of integrated circuits has been characterized by a continuing increase in the density with which devices can be formed in a silicon semiconductor chip or substrate. The interconnection of such high density devices within the chip requires the formation on its surface of conductors that are extremely small and spaced closely together, and in many cases conductive patterns that overlap, or, in the terminology of the technology, are vertically spaced at different conductor levels. The use of two or more levels of conductors, of course, requires a deposition of a dependable insulation on the lower level of conductors so that the overlapping upper level can be made without the risk of accidental short circuits or other conductive anomalies.

The lower-most level of conductors, usually referred to as "the first conductor level," is normally insulated from the semiconductor wafer or chip portion of the integrated circuit by silicon dioxide which is easily formed over the silicon wafer by, for example, chemical vapor deposition (CVD). Silicon dioxide is a favored material for conductor insulation because of its good thermal and electrical characteristics and because it is easily patterned by selective masking and etching. Unfortunately, CVD cannot normally be used to deposit silicon dioxide over the first conductor level because the high temperatures normally required would melt or damage conductors made of such metals as aluminum.

For this reason, it has become a widely accepted practice to deposit silicon dioxide from a radio-frequency plasma containing a silicon component. Such plasmas are formed in reactors including opposite parallel plate electrodes, one of which is grounded and one excited by a radio-frequency source. The plasma provides energy for enhancing the reaction required for silicon dioxide formation and deposition at temperatures lower than those required for CVD, and for this reason is sometimes known as plasma enhanced chemical vapor deposition or PECVD. It should be noted that other oxides such as silicon monoxide may be deposited by this process, but the predominant deposited material is silicon dioxide, which is the term that will be used herein. Also, deposition is on a "substrate," which may be part of the semiconductor, the metal conductors, or previously deposited or grown silicon dioxide.

The source of silicon used in plasma deposition may be of any of a number of silane gases or other gases containing silicon. The copending application of Dean et al., Ser. No. 175,567, filed Mar. 31, 1988, assigned to Bell Laboratories, Inc., hereby incorporated herein by reference, describes the advantages of using tetraethoxysilane (TEOS) together with oxygen as the plasma deposition atmosphere. The application describes the difficulty of making silicon dioxide depositions on integrated circuits having closely spaced metal conductors such as to provide dependable insulation for all conductors. The usual approach to this problem is to try to make a deposition as conformal as possible; that is, to make the silicon dioxide coating conform as closely as possible to the outer surface configuration of the conductors. Particular attention has been made to insure a dependable coverage of the sharp corners of conductors that inevitably result from the usual mask and etch process for defining the conductor patterns.

However, we have found that even conformal coatings create problems when it is desired to make more than one level of conductor patterns. In particular, the conformal coatings of closely-spaced adjacent conductors tend to grow together in such a way as to create a void or other characteristic imperfection within the deposited silicon dioxide. After deposition, the upper surface of a silicon dioxide is typically etched or ground to make it flat and a subsequent conductor pattern is formed over the deposited silicon dioxide. Voids or serious imperfections in the deposited silicon dioxide often cause unpredictable variations of the structural and insulative qualities of the coating.

Accordingly, there is a need for a method for depositing silicon dioxide over closely-spaced metal conductors that will provide dependable insulation and support for a second level of electrodes made on such deposited silicon dioxide.

SUMMARY OF THE INVENTION

We have found that stable, relatively defect-free coatings of deposited silicon dioxide can be made over a substrate containing closely-spaced conductors by using a plasma deposition process that favors deposition on horizontal surfaces rather than vertical surfaces. In particular, such plasma deposition may involve the use of tetraethoxysilane (TEOS) as the silicon source along with a gaseous material that adsorbs readily to the substrate and inhibits the deposition of silicon dioxide on the substrate. The radio-frequency plasma in which the substrate is a located is a high-power plasma; for example, the radio-frequency power is 100 watts or more. The high power plasma accelerates ions along electric field lines perpendicular to the substrate thereby causing ions to strike horizontal surfaces of the substrate with a significantly higher kinetic energy and density than the energy and density of impingement on vertical surfaces of the substrate. As a consequence, molecules of the inhibiting gas are removed by ion impact preferentially from horizontal surfaces. The TEOS molecule has a high surface diffusion, or high surface mobility, which tends to make it available at horizontal reaction sites where it can form a deposited silicon dioxide molecule due to prior removal of an inhibiting gas molecule. The silicon dioxide therefore deposits preferentially on the horizontal surfaces and grows predominantly in the vertical direction. Since there is relatively little deposition on the vertical surfaces and relatively little growth in the horizontal direction, there is a smaller chance of forming imperfections as a consequence of two closely-spaced vertical sidewalls "growing together." We have found that the final coating of silicon dioxide is more uniform and less prone to defects than comparable silicon dioxide deposition over closely-spaced conductors in which care has been taken to make such deposition "conformal."

These and other objects, features and advantages will be better understood from a consideration of the following detailed description taken in conjunction with the accompanying drawing.

DETAILED DESCRIPTION

Figure 1:
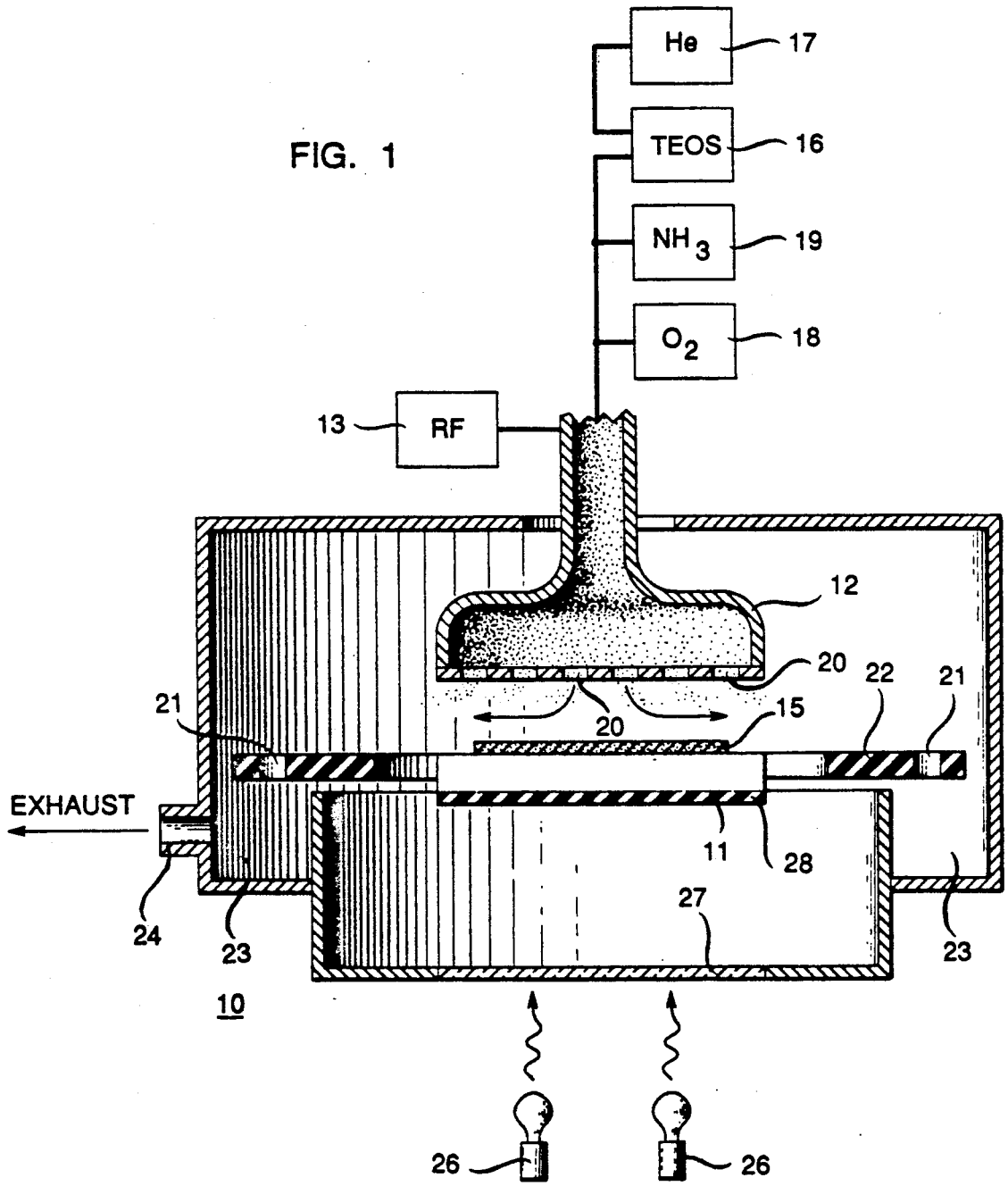
FIG. 1 is a schematic view of plasma deposition reactor apparatus that may be used in accordance with an illustrative embodiment of the invention.

Referring now to FIG. 1, there is shown a plasma deposition reactor 10 that may be used for depositing silicon dioxide in accordance with the invention. The reactor includes opposite generally parallel electrodes 11 and 12 between which a radio-frequency plasma is formed. The reactor 10 may be of the general type known as the "Precision 5000 System," commercially available from the Applied Materials Company of Santa Clara, Calif. The electrode 12 is excited with radio-frequency energy, typically 13.56 megahertz from a radio-frequency source 13. Electrode 11 is grounded as shown and supports a silicon wafer 15 which constitutes a substrate upon which a silicon dioxide ($SiO_2$) deposition is to be made. The silicon component of $SiO_2$ for deposition from the plasma is obtained from gaseous tetraethoxysilane (TEOS) derived from a heated liquid source 16. Typically, TEOS is commercially available as a liquid and a vaporized form may be obtained by bubbling helium from a source 17 through the liquid TEOS and deriving vaporized molecules from the TEOS container as indicated schematically. Preferably also included in the plasma atmosphere is oxygen gas that may be derived from a source 18. In accordance with the invention, ammonia gas or $NH_3$ derived from a source 19 is also used, although $NF_3$ may alternatively be used as will be discussed below. Various flow meters and other apparatus for injecting controlled amounts of the desired gases are known in the art and for the sake of brevity have not been shown or described.

The R-F driven electrode 12 is hollow and contains a plurality of apertures 20 that permit the flow of injected gas as shown by the arrows. The gas thus flows radially over the surface of the silicon wafer and is guided through apertures 21 in a plate 22 to an annular vacuum channel 23 from which it is withdrawn through an exhaust 24. The lower electrode 11 is heated by a plurality of lamps 26 that direct light through a quartz window 27 so as to impinge on an aluminum oxide layer 28 of electrode 11. This heats the atmosphere to a temperature below the melting point of any metal conductors contained on the surface of the wafer 15. The purpose of the radio-frequency plasma is to ionize, and thereby to provide sufficient additional energy to, molecules of the atmosphere to permit chemical vapor deposition of silicon dioxide on a surface of the wafer 15 from the silicon and oxygen components of the atmosphere.

Figure 2:
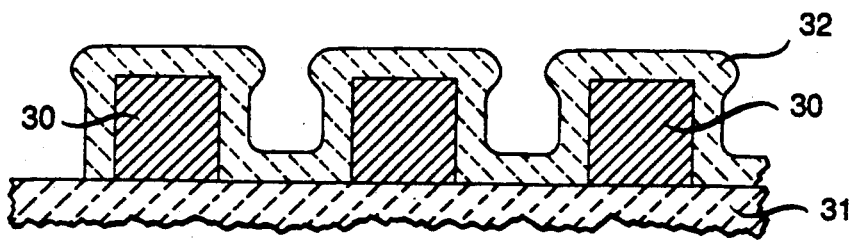
FIGS. 2 and 3 are schematic sectional views of silicon dioxide coatings made in accordance with the prior art.
Figure 3:
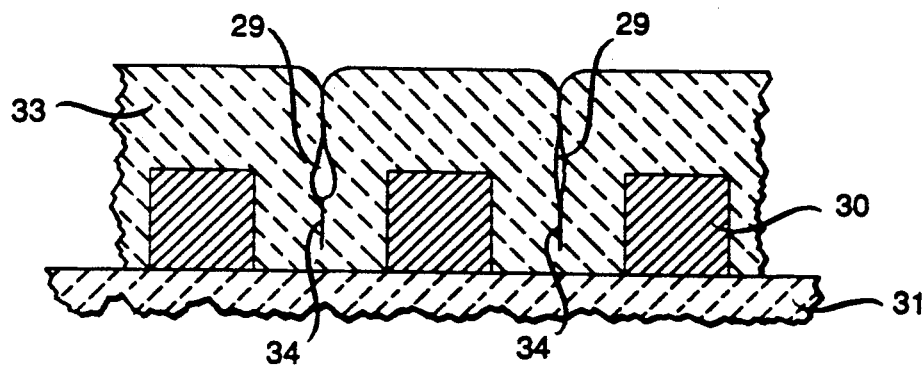

The silicon wafer 15 is typically first covered with a silicon dioxide insulating layer, typically by CVD, upon which a first conductor level is formed. It is known that conductors and deposited silicon dioxide can be made as depicted in FIGS. 2 and 3. The first conductor level comprises conductors 30, as shown in section, which are formed on the layer of CVD deposited silicon dioxide 31. Plasma deposition from TEOS is known to be capable of giving conformal coatings 32 of deposited silicon dioxide over the substrate. It is characteristic of such coatings that a slight bulge occurs at the corners of the conductors as shown due to the somewhat greater exposure of the corners to plasma molecules. With a desired thickness as shown in FIG. 2, the deposited coating 32 may be quite satisfactory especially since it offers dependable corner coverage of the conductors 30. However, with the conductors spaced closely together, significant problems occur when depositing silicon dioxide to a sufficient thickness to permit a second level of conductors to be formed.

The ratio of the height of conductors 30 to their separation, known as the aspect ratio of the structure, is shown in FIG. 2 as being approximately equal to one. Whenever both the deposited $SiO_2$ thickness and the aspect ratio become large, deposited silicon dioxide from adjacent vertical walls is likely to grow together as shown in FIG. 3. As thicker quantities of silicon dioxide are deposited on the structure, the corners are likely to meet prior to complete deposition in the space between the conductors. As shown in FIG. 3 this may result in the formation of a void 29. Even if voids 29 are not formed, there will inevitably be a discontinuity or "seam" 34 due to the merger of deposited silicon dioxide from opposite vertical walls. These imperfections in the deposited silicon dioxide layer 33 of FIG. 3 can cause nonuniformities in the insulative characteristics of the silicon dioxide and may further constitute regions of nonuniform etching of the silicon dioxide layer. Undesired breakdown can occur in such regions of imperfection during operation of the finished integrated circuit. One can appreciate that this problem is likely to occur whenever the thickness of deposited silicon dioxide is more than one-half the separation distance between adjacent conductors.

Figure 4:
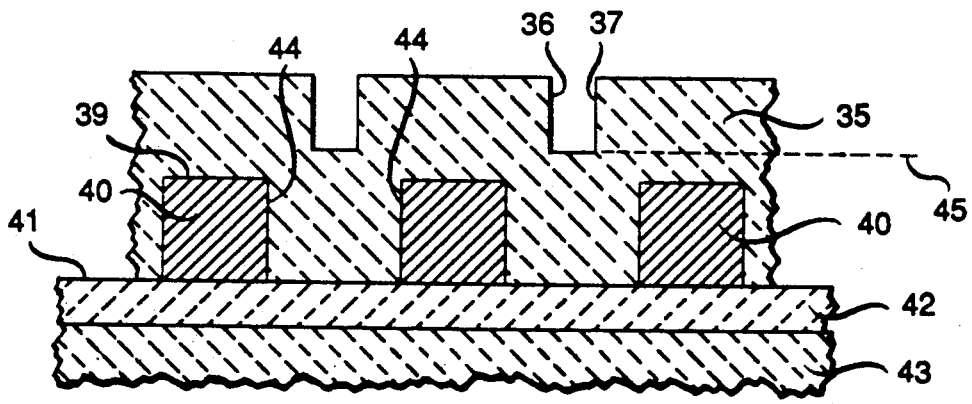
FIGS. 4 and 5 are schematic sectional views showing silicon dioxide coatings made in accordance with one embodiment of the invention.

In accordance with our invention, these problems are solved by devising a plasma deposition process that favors deposition on horizontal surfaces of the substrate over that on vertical surfaces. As shown in FIG. 4, this can result in the deposition of a silicon dioxide layer 35 that may be made very thick without any contact between opposite vertical sidewalls 36 and 37. With deposition preferentially on the horizontal surfaces, the layer becomes progressively thicker in the vertical direction with very little progressive growth of the deposited layer thickness in the horizontal direction. Since progressive deposition occurs preferentially in one direction, we refer to this as "anisotropic" deposition of the silicon dioxide, as opposed to substantially equal deposition in all directions, as is characteristic of conventional conformal or "isotropic" silicon dioxide deposition.

In accordance with our invention, anisotropic deposition is accomplished by (1) providing in the gas plasma atmosphere a gas that inhibits silicon dioxide deposition, and (2) using a sufficiently high radio-frequency power in the plasma to remove such inhibiting gas preferentially from horizontal surfaces of the substrate. It is also preferred that the silicon source in the atmosphere be a molecule that has a high surface mobility or a high surface diffusion so that it will diffuse promptly to surface sites on the horizontal surfaces that have been made available due to impact removal of an inhibiting gas molecule. For this purpose, TEOS as a source for silicon has been found to work well. We have found that either ammonia, $NH_3$, or nitrogen fluoride, $NF_3$, will work as an inhibiting gas, although we believe that other inhibiting gases will likewise be found to work. $NH_3$ and $NF_3$ are also preferable because they adsorb strongly to the deposited surfaces, and therefore "stick"

to the vertical surfaces to reduce $SiO_2$ deposition thereat. $NF_3$ has the disadvantage of being highly reactive and therefore difficult to work with. While the TEOS may be a source of oxygen as well as silicon, a separate source of oxygen is preferred for giving high quality $SiO_2$.

Referring to FIG. 4, in accordance with standard practice, the silicon dioxide layer 42 is deposited on silicon wafer 43 by CVD. The horizontal surface of the substrate upon which $SiO_2$ deposition is then made are the horizontal surfaces 39 of the metal conductors 40 and the horizontal surface 41 of the CVD silicon dioxide 42. During the deposition of the silicon dioxide 35, the $NH_3$ molecules tend to inhibit the reaction that results in silicon dioxide deposition. However, with a high radio-frequency power of 100 watts or more, there are more energetic ion collisions of molecules from the plasma with horizontal surfaces 39 and 41 than with vertical surfaces 44. This is because the electric field lines extending from the substrate extend essentially in the vertical direction. With a relatively high radio-frequency electrical power, this will result in more energetic collisions with the horizontal surfaces than the vertical surfaces, both in terms of the number and the energy of impacting ions and molecules, thus resulting in a lower surface density of $NH_3$ molecules on the horizontal surfaces than on the vertical surfaces. TEOS molecules move quickly to occupy available sites on horizontal surfaces and react to form $SiO_2$.

With our invention, there will normally be some deposition on the vertical surfaces, but we have found that deposition ratios of more than two to one can quite conveniently be made. After the deposition shown in FIG. 4, the upper surface of the deposited silicon dioxide may be etched or ground to the horizontal level shown by dashed line 45. If this is done, the remaining silicon dioxide is free of voids and seams despite the close proximity of vertical edges 44. As a consequence, the new $SiO_2$ surface can provide insulation and support for a second level of conductors.

Figure 5:
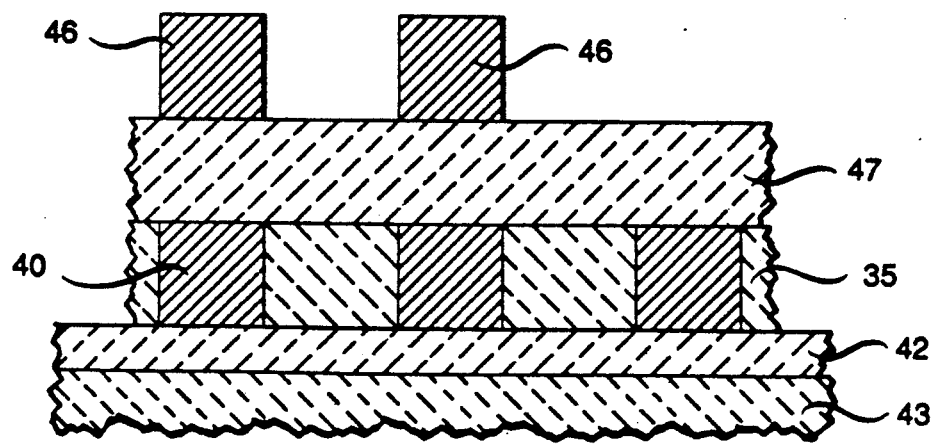

Referring to FIG. 5, the currently preferred method for using the invention to make two conductor levels is to grind the deposited layer 35 to a horizontal level equal to the top level of conductors 40 by using the conductors as a "stop" to the grinding operation. Thereafter, a second deposited silicon dioxide layer 47 is made on the flat upper surface of conductors 40 and silicon dioxide layer 35 and, after completion of layer 47, the second level of conductors 46 is formed. As is known, etching may also be used to flatten or planarize the upper surface of deposited layer 35.

In demonstrations of the invention, as mentioned before, we used a reactor 10 as shown in FIG. 1 of the general type known as the Applied Materials Precision 5000 System. The pressure in the reactor was nine torr, the spacing between electrodes 11 and 12 was 200 mils, the wafer was located on the grounded electrode as shown in FIG. 1 and was heated to a temperature of 390 degrees centigrade. TEOS was introduced by flowing 300 standard cubic centimeters per minute (sccm) of helium through the TEOS bubbler 16 with a liquid TEOS temperature of 34° C. Oxygen was introduced at a rate of 300 sccm. 350 watts of RF power at 13.56 megahertz drove the electrode 12 as shown. The wafers 15 each had a five inch diameter.

With 20 sccm of $NH_3$ being introduced as shown, the ratio of deposited silicon dioxide thickness on the horizontal surfaces ("b") to the thickness of deposited silicon dioxide on the vertical surfaces ("s") was 2.336, that is, b/s=2.336. With $NH_3$ flowing at 100 sccm, the ratio b/s was also 2.336, which indicated that increases in the ammonia constituency do not change very much the ratio of thicknesses. With 20 sccm of $NF_3$, the b/s ratio was 2.476. Various tests on optical absorbance and index of refraction of the $SiO_2$ films formed lead us to conclude that the quality of deposited $SiO_2$ made with our invention is satisfactory for integrated circuit purposes. However, such tests implied that the films made with $NH_3$ were superior to those made with $NF_3$. In view of the fact that $NF_3$ is a relatively hazardous material, such tests would indicate for most purposes $NH_3$ is the superior inhibiting gas, although $NF_3$ gave a somewhat larger b/s ratio.

We have every reason to believe that materials other than $NF_3$ or $NH_3$ can be found that will inhibit silicon dioxide deposition in accordance with our invention.

The foregoing apparatus and processes have been described so as merely to illustrate the principles of the invention. Other radio-frequency plasma deposition apparatus could be used as is within the purview of those skilled in the art. Various other embodiments and modifications may be made by those skilled in the art without departing from the spirit and scope of the invention.

We claim:

1. A method for making an integrated circuit device comprising the steps of depositing silicon dioxide on a substrate by subjecting the substrate to a radio-frequency plasma in an atmosphere including a source of silicon and a source of oxygen, characterized in that:

there is introduced into the atmosphere an inhibiting gas that inhibits the deposition of silicon dioxide on the substrate surface;

and the radio-frequency plasma is formed by subjecting the atmosphere to radio-frequency power in excess of 100 watts, whereby the density of said inhibiting gas is reduced on horizontal surfaces of the substrate with respect to vertical surfaces of the substrate, thereby promoting preferential silicon dioxide deposition on the horizontal surfaces.

2. The method of claim 1 further characterized in that:

the source of silicon comprises tetraethoxysilane.

3. The method of claim 1 further characterized in that:

the inhibiting gas comprises $NH_3$.

4. The method of claim 1 further characterized in that:

the inhibiting gas comprises $NF_3$.

5. The method of claim 2 further characterized in that:

the atmosphere includes oxygen and an inert gas.

6. The method of claim 2 further characterized in that:

the radio-frequency plasma is produced by parallel first and second electrodes, the first electrode being connected to a radio-frequency power source, the second electrode being grounded, and the substrate is supported on one of the electrodes, and the inhibiting gas is a gas that strongly adsorbs to the substrate.

7. The method of claim 6 further characterized in that the inhibiting gas comprises $NH_3$.

8. The method of claim 6 further characterized in that the inhibiting gas comprises $NF_3$.

9. A method for making integrated circuits comprising the steps of:

forming a first metal conductor pattern over a semiconductor substrate, placing the substrate on one electrode of a radio-frequency reactor having two electrodes, introducing into the reactor an atmosphere including tetraethoxysilane, exciting with radio-frequency power one electrode of the reactor so as to cause silicon dioxide to be deposited on the substrate, characterized in that:

the excited electrode is excited with radio-frequency power in excess of 100 watts;

and the atmosphere includes a gas that inhibits deposition of silicon dioxide on the substrate.

10. The method of claim 9 further characterized the inhibiting gas is selected from the group consisting of $NH_3$ and $NF_3$.

11. The method of claim 10 further characterized in that:

the atmosphere further includes oxygen.

12. The method of claim 11 further characterized in that:

one of the two radio-frequency electrodes is excited by radio-frequency energy, a second one of the two electrodes is grounded, and the substrate is contained on the second electrode.

13. The method of claim 9 further characterized in that:

the silicon dioxide is deposited to a thickness that exceeds half the separation distance of two adjacent conductors of the first metal conductor pattern.

14. The method of claim 12 further characterized in that:

a second metal conductor pattern is formed over the deposited silicon dioxide.

15. The method of claim 13 further characterized in that:

the upper surface of the silicon dioxide is planarized and thereafter a second metal conductor pattern is formed over the planarized silicon dioxide surface.

16. The method of claim 15 is further characterized in that:

after planarization a second coating of silicon dioxide is deposited on the planarized silicon dioxide and thereafter the second metal conductor pattern is formed on the second coating of silicon dioxide.

* * * * *

UNITED STATES PATENT AND TRADEMARK OFFICE
CERTIFICATE OF CORRECTION

PATENT NO. : 5,013,691

DATED : May 7, 1991

INVENTOR(S) : E. R. Lory - L. J. Olmer

It is certified that error appears in the above—identified patent and that said Letters Patent is hereby corrected as shown below:

Column 3, line 5
  after "invention" change the period to a semicolon;

Column 3, line 7
  after "art" change the period to --; and--.

Column 6, line 65
  after "that" insert a colon;

Column 6, line 67
  after "that" insert a colon.

Column 7, line 15
  after "characterized" insert --in that:--.

Signed and Sealed this

Twenty-second Day of September, 1992

Attest:

DOUGLAS B. COMER

*Attesting Officer*     *Acting Commissioner of Patents and Trademarks*